United States Patent
Lee et al.

(10) Patent No.: US 11,595,593 B2
(45) Date of Patent: Feb. 28, 2023

(54) INFRARED IMAGE SENSOR

(71) Applicant: SAMSUNG ELECTRO-MECHANICS CO., LTD., Suwon-si (KR)

(72) Inventors: Chang Seok Lee, Suwon-si (KR); Joon Hyung Lim, Suwon-si (KR); Ji Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/211,312

(22) Filed: Mar. 24, 2021

(65) Prior Publication Data
US 2022/0210346 A1  Jun. 30, 2022

(30) Foreign Application Priority Data
Dec. 24, 2020  (KR) .......................... 10-2020-0183637

(51) Int. Cl.
| | |
|---|---|
| *H04N 5/33* | (2006.01) |
| *G01J 5/02* | (2022.01) |
| *H01L 27/14* | (2006.01) |
| *H01L 27/146* | (2006.01) |
| *G01J 5/00* | (2022.01) |

(52) U.S. Cl.
CPC .................. *H04N 5/33* (2013.01); *G01J 5/02* (2013.01); *H01L 27/14649* (2013.01); *G01J 2005/0077* (2013.01)

(58) Field of Classification Search
None
See application file for complete search history.

(56) References Cited

U.S. PATENT DOCUMENTS

| | | | | |
|---|---|---|---|---|
| 6,011,257 A | * | 1/2000 | Endoh | H04N 5/365 250/252.1 |
| 2007/0125949 A1 | * | 6/2007 | Murata | G01J 1/46 348/E5.09 |
| 2008/0251721 A1 | * | 10/2008 | Ueno | G01J 5/08 250/332 |
| 2018/0206805 A1 | * | 7/2018 | Onouchi | A61B 6/032 |
| 2018/0283958 A1 | * | 10/2018 | Forg | G01J 5/12 |
| 2019/0137331 A1 | * | 5/2019 | Hosaka | G01J 5/48 |

(Continued)

FOREIGN PATENT DOCUMENTS

| | | |
|---|---|---|
| JP | 2970586 B2 | 11/1999 |
| JP | 2016-511907 A | 4/2016 |

(Continued)

OTHER PUBLICATIONS

Korean Office Action dated Jan. 4, 2022 in corresponding Korean Patent Application No. 10-2020-0183637 (7 pages in English and 5 pages in Korean).

*Primary Examiner* — Reza Aghevli
(74) *Attorney, Agent, or Firm* — NSIP Law

(57) ABSTRACT

An infrared image sensor includes: a plurality of reference circuits configured to provide a plurality of reference analog values to a plurality of bolometer cells, respectively; a front-end analog circuit configured to collect a plurality of output analog values according to the plurality of reference analog values; and a noise suppression circuit configured to switch a correspondence between the plurality of bolometer cells and the plurality of reference analog values at unit time intervals.

18 Claims, 10 Drawing Sheets

(56) References Cited

U.S. PATENT DOCUMENTS

2019/0368941 A1* 12/2019 Aziz ..................... H04N 5/33
2019/0373192 A1* 12/2019 Cannata ............... H04N 5/3658

FOREIGN PATENT DOCUMENTS

| JP | 2018-531399 A | 10/2018 |
| KR | 10-2000-0067627 A | 11/2000 |
| KR | 10-2009-0030768 A | 3/2009 |
| KR | 10-2019-0040124 A | 4/2019 |
| WO | WO 2014/158311 A1 | 10/2014 |
| WO | WO 2017/033675 A1 | 3/2017 |

* cited by examiner

INFRARED IMAGE SENSOR

CROSS-REFERENCE TO RELATED APPLICATIONS

This application claims the benefit under 35 U.S.C. § 119(a) of Korean Patent Application No. 10-2020-0183637 filed on Dec. 24, 2020 in the Korean Intellectual Property Office, the entire disclosure of which is incorporated herein by reference for all purposes.

BACKGROUND

1. Field

The following description relates to an infrared image sensor.

2. Description of Related Art

An existing infrared image sensor, which is used to see an object, even in a dark environment, using infrared light radiated by the object has been widely used for military, medical, and industrial purposes. Existing infrared imaging systems have mainly been developed for the security and defense industries. However, in recent years, the market for infrared imaging systems has rapidly expanded into civilian industrial sectors such as vehicle sight assistance devices and security cameras. Recently, research has been undertaken into using an infrared imaging system for a mobile device or wearable device. Accordingly, there is an increasing demand for an infrared camera including an infrared image sensor.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an infrared image sensor includes: a plurality of reference circuits configured to provide a plurality of reference analog values to a plurality of bolometer cells, respectively; a front-end analog circuit configured to collect a plurality of output analog values according to the plurality of reference analog values; and a noise suppression circuit configured to switch a correspondence between the plurality of bolometer cells and the plurality of reference analog values at unit time intervals.

The noise suppression circuit may be further configured to perform switching so as to repeat the correspondence between the plurality of bolometer cells and the plurality of reference analog values at image time intervals that are longer than the unit time interval.

The plurality of reference circuits may include first to m-th reference circuits. The noise suppression circuit is further configured to perform switching so that the first to m-th reference circuits correspond to the first to m-th bolometer cells, respectively, at least once during the image time interval.

The front-end analog circuit may be further configured to output a plurality of infrared image values to which a plurality of output analog values before the switching of the correspondence between the plurality of bolometer cells and the plurality of reference analog values, and a plurality of output analog values after the switching are applied together.

The infrared image sensor may further include a multiplexer configured to receive the plurality of infrared image values through a plurality of input paths, and provide, to an AD converter, the plurality of infrared image values through output paths less in number than the plurality of input paths.

The front-end analog circuit may include a plurality of integrators. Each of the plurality of integrators may be configured to sequentially integrate the plurality of output analog values before and after the switching of the correspondence between the plurality of bolometer cells and the plurality of reference analog values.

The plurality of bolometer cells may be configured as a plurality of cell groups each including two or more bolometer cells. The front-end analog circuit may include a plurality of integrators in one-to-one correspondence with the plurality of cell groups and configured to integrate at least two corresponding output analog values, among the plurality of output analog values, together.

The front-end analog circuit may further include a plurality of branch nodes positioned between the plurality of cell groups and the plurality of integrators, and each electrically connecting transfer paths for the at least two corresponding output analog values to each other.

Each of the plurality of bolometer cells may include a plurality of bolometer pixels.

In another general aspect, an infrared image sensor includes: a plurality of reference circuits configured to provide a plurality of reference analog values to a plurality of bolometer cells, respectively, each of the plurality of bolometer cells including a plurality of bolometer pixels; and a front-end analog circuit configured to collect a plurality of output analog values according to the plurality of reference analog values. The plurality of bolometer cells are configured as a plurality of cell groups each including two or more bolometer cells. The front-end analog circuit includes a plurality of integrators in one-to-one correspondence with the plurality of cell groups and configured to integrate at least two corresponding output analog values, among the of output analog values, together.

The front-end analog circuit may further include a plurality of first amplifiers positioned between the plurality of cell groups and the plurality of integrators, and electrically connected to transfer paths for the plurality of output analog values, respectively.

The front-end analog circuit may further include a plurality of third amplifiers disposed on a plurality of feedback paths from an output to an input of a corresponding integrator among the plurality of integrators. Each of the plurality of integrators may include a second amplifier and a capacitor electrically connected to the second amplifier in parallel.

The plurality of first amplifiers, the second amplifier, and the plurality of third amplifiers may each be configured as a buffer circuit of which an input impedance is greater than an output impedance.

The front-end analog circuit may further include a plurality of chopper circuits connected between the plurality of cell groups and the plurality of integrators, and electrically connected to transfer paths for the plurality of output analog values, respectively.

The front-end analog circuit may further include a plurality of branch nodes positioned between the plurality of cell groups and the plurality of integrators, and each electrically connecting transfer paths for at least two output analog values, among the plurality of output analog values, to each other.

The front-end analog circuit may further include a plurality of chopper circuits electrically connected between the plurality of branch nodes and the plurality of integrators.

The front-end analog circuit may further include a plurality of chopper circuits disposed on a plurality of feedback paths from an output to an input of a corresponding integrator among the plurality of integrators.

The front-end analog circuit may further include a plurality of third amplifiers disposed on a plurality of feedback paths from an output to an input of a corresponding integrator among the plurality of integrators. Each of the plurality of integrators may include a second amplifier and a capacitor electrically connected to the second amplifier in parallel.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
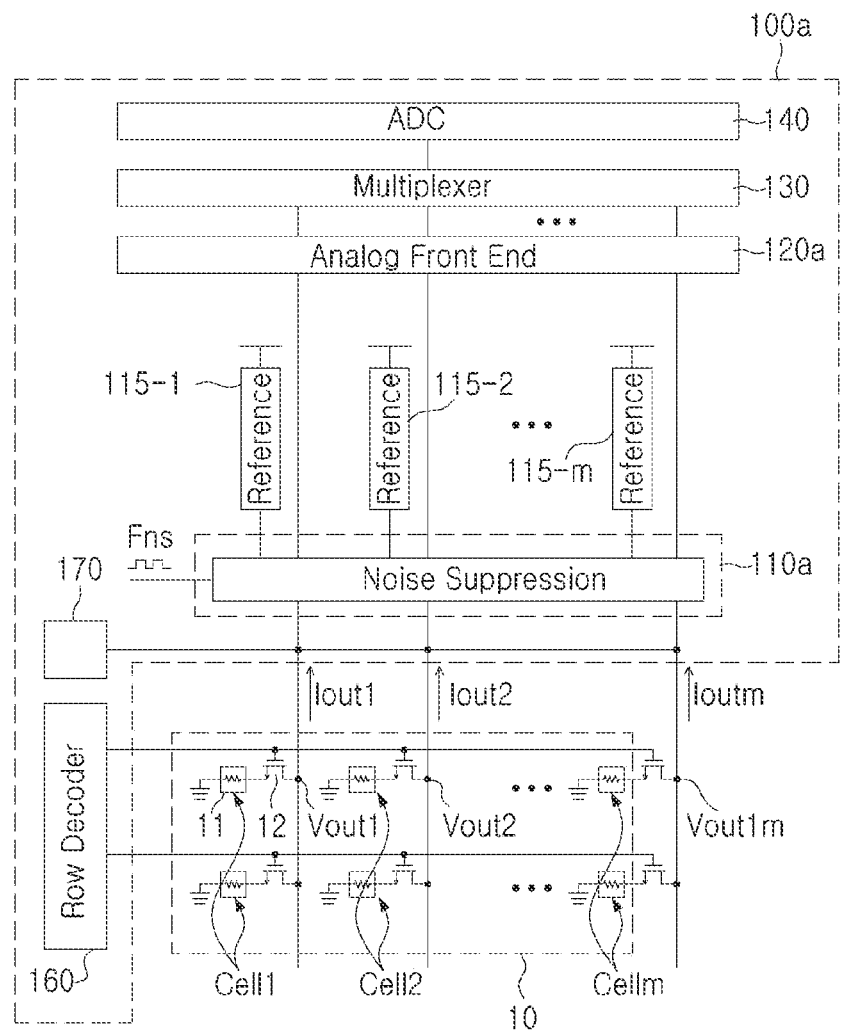
FIG. 1 is a diagram illustrating an infrared image sensor, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

FIG. 1 is a diagram illustrating an infrared image sensor 100a, according to an embodiment.

Referring to FIG. 1, the infrared image sensor 100a may include, for example, a noise suppression circuit 110a, reference circuits 115-1, 115-2, additional reference circuits through an m-th reference circuit 115-m (where m is an integer greater than or equal to 3), and a front-end analog circuit 120a. The infrared image sensor 100a may acquire an infrared image through a bolometer 10.

Although the infrared image sensor 100a may include any number of reference circuits up to the m-th reference circuit 115-m, the following description will be made with reference to the reference circuits 115-1, 115-2, and 115-m and corresponding components, signals, and parameters, in the interest of conciseness. It is to be understood that similar components, signals, and parameters would apply to any additional reference circuits included in the infrared image sensor 100a.

The bolometer 10 may have a structure in which a plurality of bolometer pixels 11 are two-dimensionally arranged, and each of the bolometer pixels 11 may have a resistance value based on energy of introduced infrared light. For example, the bolometer pixels 11 may contain vanadium oxide (VOx) and/or amorphous silicon, and may be implemented through a silicon wafer process.

In a case in which a reference voltage is provided to each of the bolometer pixels 11, output currents Iout1, Iout2, and Ioutm of the respective bolometer pixels 11 may be determined on the basis of resistance values and reference voltages of the bolometer pixels 11, respectively. In a case in which a reference current is provided to each of the bolometer pixels 11, output voltages Vout1, Vout2, and Voutm of the respective bolometer pixels 11 may be determined on the basis of the resistance values and reference currents of the bolometer pixels 11, respectively. The infrared image sensor 100a may identify the magnitudes of infrared energy at respective positions of the bolometer pixels 11 on the basis of the output currents Iout1, Iout2, and Ioutm or output voltages Vout1, Vout2, and Voutm.

For example, the bolometer 10 may include row control switches 12 respectively electrically connected between the bolometer pixels 11 and the infrared image sensor 100a.

A row decoder 160 that may be included in the infrared image sensor 100a may switch an electrical connection across each of the row control switches 12 on or off. For example, the row decoder 160 may switch an electrical connection across each of row control switches of the first row among the row control switches 12 on, and switch an electrical connection across each of row control switches of the remaining rows among the row control switches 12 off. Thereafter, the row decoder 160 may switch the electrical connection across each of the row control switches of the first row among the row control switches 12 off, and switch the electrical connection across each of row control switches of the second row among the row control switches 12 on. The above-described process may be sequentially performed on up to row control switches of the last row among the row control switches 12, and an on/off pattern of the row control switches of the first row to the last row may be repeated.

The infrared image sensor 100a may sequentially collect the output currents Iout1, Iout2, and Ioutm or output voltages Vout1, Vout2, and Voutm based on resistance values and reference voltages of bolometer pixels, among the bolometer pixels 11, adjacent to row control switches that are in an on state among the plurality of row control switches 12.

The infrared image sensor 100a may identify a correspondence between points in time at which the output currents Iout1, Iout2, and Ioutm or output voltages Vout1, Vout2, and Voutm are collected through the row decoder 160, and row numbers of collection targets. Therefore, the same reference voltage/current may be used for bolometer pixels with the same row number among the plurality of bolometer pixels 11, and the same output current/voltage path may be used.

Therefore, the bolometer 10 may include bolometer cells cell1, cell2, and cellm (i.e., a first bolometer cell cell1 to an m-th bolometer cell cellm), according to column numbers (or row numbers) of the bolometer pixels 11.

The front-end analog circuit 120a may collect output analog values according to reference analog values provided to the bolometer cells cell1, cell2, and cellm of the bolometer 10. The output analog values may be the output currents Iout1, Iout2, and Ioutm or output voltages Vout1, Vout2, and Voutm.

The reference circuits 115-1, 115-2, and 115-m may provide the reference analog values (for example, the reference voltages or reference currents) to the bolometer cells cell1, cell2, and cellm of the bolometer 10, respectively. For example, the reference circuits 115-1, 115-2, and 115-m may each include a circuit that generates a reference voltage or reference current without being affected by an external environment or process error, such as a bandgap reference circuit.

The reference circuits 115-1, 115-2, and 115-m will be referred to as a first reference circuit 115-1, a second reference circuit 115-2, and an m-th reference circuit 115-m hereinafter. The number of reference circuits 115-1 to 115-m may be the same as the number of the plurality of bolometer cells cell1 to cellm of the bolometer 10.

The first reference circuit 115-1, the second reference circuit 115-2, and the m-th reference circuit 115-m may be affected by a process error in a bolometer manufacturing process (for example, the silicon wafer process), and at least one of thermal noise or flicker noise may be introduced into the output current Iout1, Iout2, and Ioutm or output voltage Vout1, Vout2, and Voutm due to an influence of the process error.

The noise suppression circuit 110a may switch a correspondence between the bolometer cells cent cell2, and cellm of the bolometer 10 and the reference analog values of the reference circuits 115-1, 115-2, and 115-m at unit time intervals. For example, the noise suppression circuit 110a may receive or generate a switching signal Fns and perform a switching operation on the basis of the switching signal Fns.

Accordingly, the noise introduced into the output currents Iout1, Iout2, and Ioutm or output voltages Vout1, Vout2, and Voutm may be divided or averaged, and thus, an overall magnitude of the noise of the output currents Iout1, Iout2, and Ioutm or output voltages Vout1, Vout2, and Voutm may be reduced. Therefore, the infrared image sensor 100a may reduce noise of the acquired infrared image.

The front-end analog circuit 120a may output a plurality of infrared image values to which a plurality of output analog values before the switching of the correspondence between the bolometer cells cell1, cell2, and cellm of the bolometer 10 and the reference analog values of the reference circuits 115-1, 115-2, and 115-m, and output analog values after the switching are applied together. Accordingly, the infrared image values may correspond to the output currents Iout1, Iout2, and Ioutm or output voltages Vout1, Vout2, and Voutm whose noise is divided or averaged.

A multiplexer 130 that may be included in the infrared image sensor 100a may receive the infrared image values from the front-end analog circuit 120a through a plurality of input paths, and may provide, to an AD converter 140, the infrared image values through output paths less in number than the input paths.

The AD converter 140 may convert the infrared image values into digital values. The digital values may be converted into a final infrared image through image processing performed by an image signal processor (ISP).

An offset canceller 170 that may be included in the infrared image sensor 100a may perform processing (for example, an offset canceling voltage or offset canceling current is applied to a bolometer cell of a specific column) in an analog manner so as to cancel imbalance between the reference analog values of the reference circuits 115-1, 115-2, and 115-m. Fine noise that may be generated due to an operation of the offset canceller 170 may be moved to an unused frequency range through the switching operation of the noise suppression circuit 110a, or may be divided or averaged.

Figure 2:
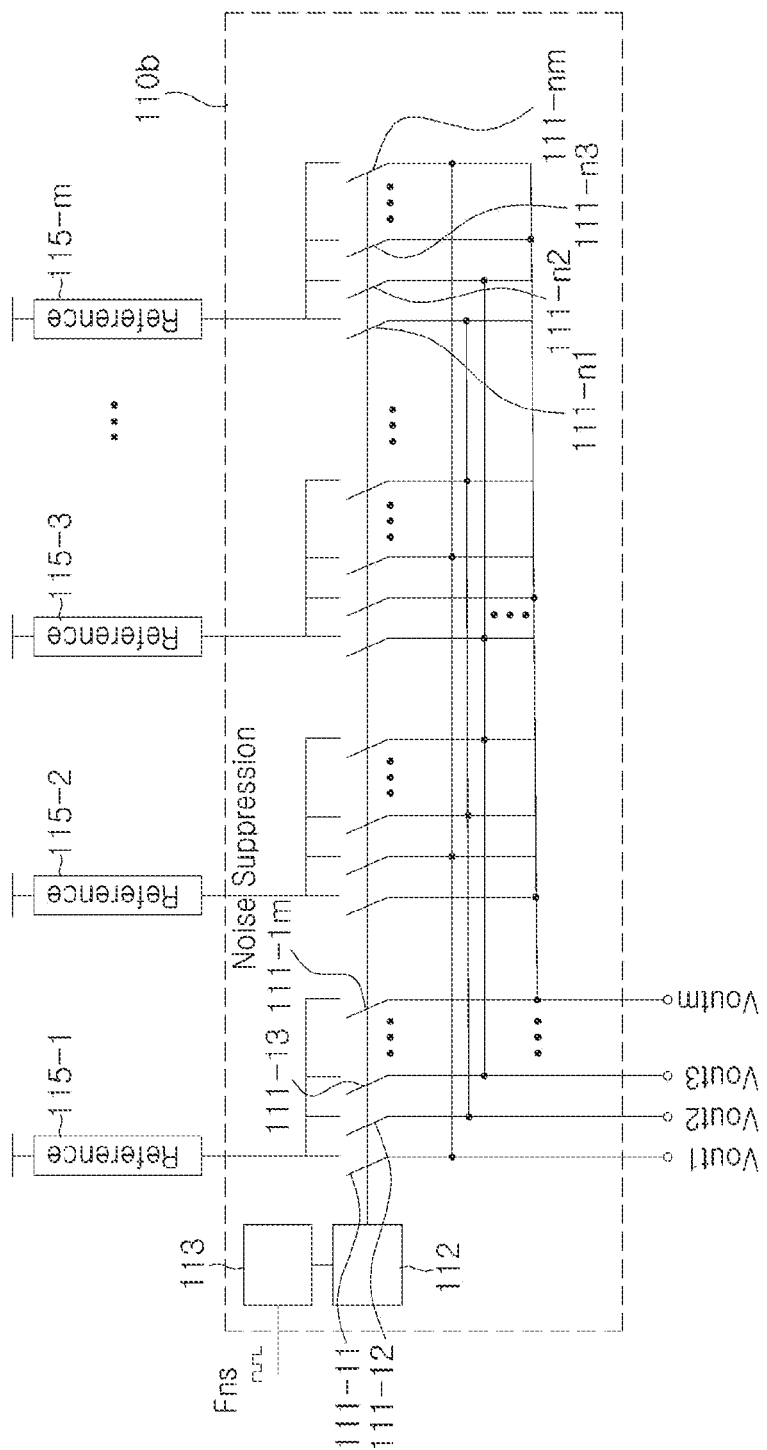
FIG. 2 is a diagram illustrating a noise suppression circuit of the infrared image sensor illustrated in FIG. 1, according to an embodiment.
Figure 3:
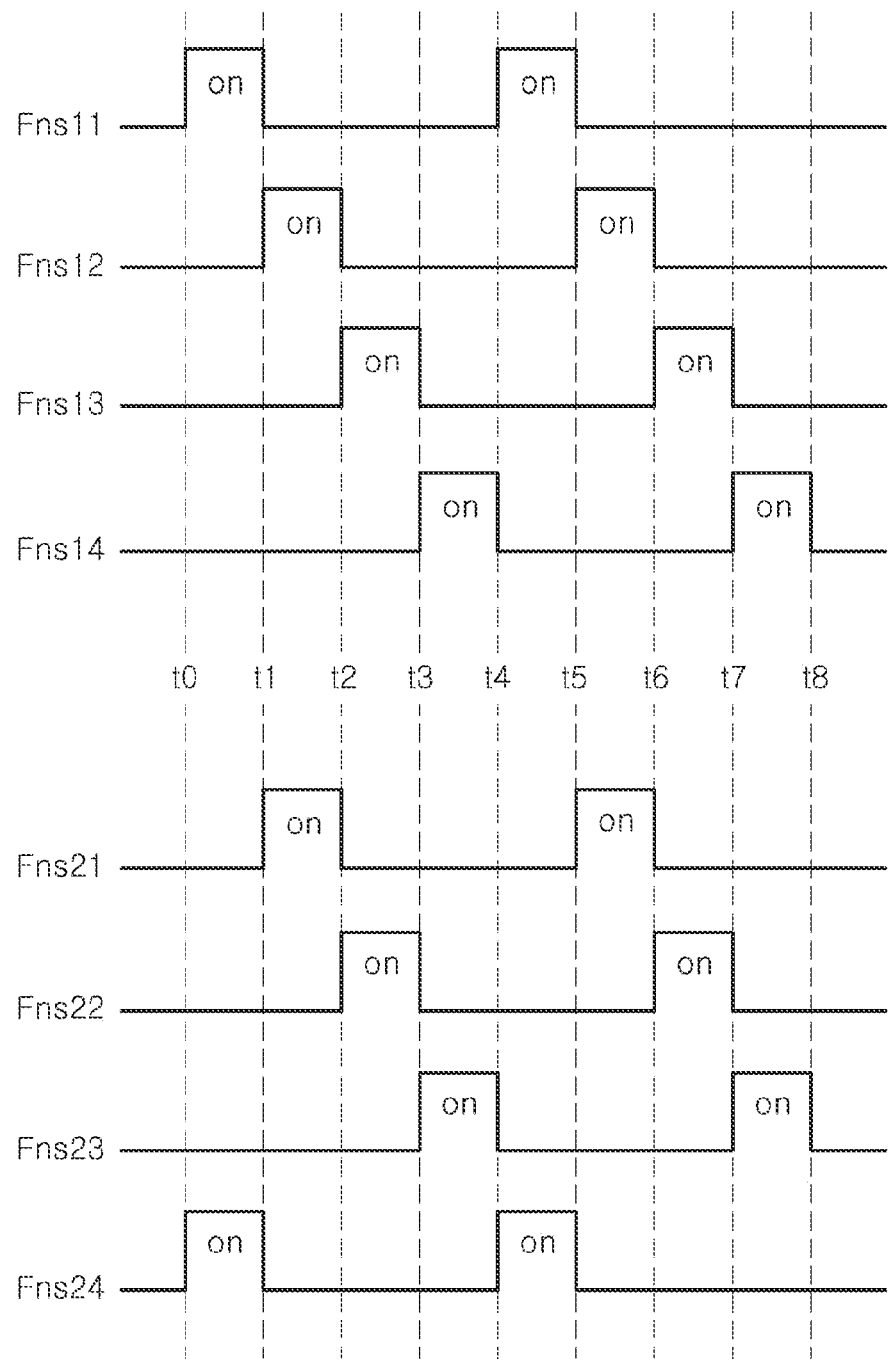
FIG. 3 is a diagram illustrating switching signals input to a plurality of switches of the noise suppression circuit illustrated in FIG. 2, according to an embodiment.

FIG. 2 is a diagram illustrating a noise suppression circuit 110b that may be included in the infrared image sensor 100a, according to an embodiment. FIG. 3 is a diagram illustrating switching signals input to a plurality of switches of the noise suppression 110b.

Referring to FIG. 2, the noise suppression circuit 110b may include a plurality of switches 111-11, 111-12, 111-13, 111-1m, 111-n1, 111-n2, 111-n3, and 111-nm electrically connected between the reference circuits 115-1, 115-2, 115-3, and 115-m, and the bolometer.

The noise suppression circuit 110b may perform switching so as to repeat a correspondence between a plurality of output analog values (for example, Vout1, Vout2, Vout3, and Voutm) of the plurality of bolometer cells and a plurality of reference analog values of the reference circuits 115-1, 115-2, 115-3, and 115-m at image time intervals that are longer than the unit time interval.

The noise suppression circuit 110b may perform switching so that the first reference circuit 115-1 to the m-th reference circuit 115-m correspond to the output analog values (for example, Vout1, Vout2, Vout3, and Voutm) of the first bolometer cell to the m-th bolometer cell, respectively, at least once during the image time interval.

The unit time interval may be at least one of a first unit time interval from a time point t0 to a time point t1, a second unit time interval from the time point t1 to a time point t2, a third unit time interval from the time point t2 to a time point t3, a fourth unit time interval from the time point t3 to a time point t4, a fifth unit time interval from the time point t4 to a time point t5, a sixth unit time interval from the time point t5 to a time point t6, a seventh unit time interval from the time point t6 to a time point t7, and an eighth unit time interval from the time point t7 to a time point t8. The image time interval may be one of a first image time interval from the time point t0 to the time point t4 and a second image time interval from the time point t4 to the time point t8.

For example, referring to FIGS. 2 and 3, on/off switching of an eleventh switch 111-11 may be determined on the basis of an eleventh switching signal Fns11, on/off switching of a twelfth switch 111-12 may be determined on the basis of a twelfth switching signal Fns12, on/off switching of a thirteenth switch 111-13 may be determined on the basis of a thirteenth switching signal Fns13, on/off switching of a fourteenth switch 111-14 may be determined on the basis of a fourteenth switching signal Fns14, on/off switching of an n1-th switch 111-n1 may be determined on the basis of a twenty-first switching signal Fns21, an n2-th switch 111-n2 may be determined on the basis of a twenty-second switching signal Fns22, an n3-th switch 111-n3 may be determined on the basis of a twenty-third switching signal Fns23, and an n4-th switch 111-n4 may be determined on the basis of a twenty-fourth switching signal Fns24.

The eleventh switch 111-11 and the n4-th switch 111-n4 may be in an on state during the first unit time interval (t0 to t1) or the fifth unit time interval (t4 to t5), the first reference circuit 115-1 may correspond to a first output analog value (for example, Vout1), and the m-th reference circuit 115-m may correspond to an m-th output analog value (for example, Voutm).

The twelfth switch 111-12 and the n1-th switch 111-n1 may be in an on state during the second unit time interval (t1 to t2) or the sixth unit time interval (t5 to t6), the first reference circuit 115-1 may correspond to a second output analog value (for example, Vout2), and the m-th reference circuit 115-m may correspond to the first output analog value (for example, Vout1).

The thirteenth switch 111-13 and the n2-th switch 111-n2 may be in an on state during the third unit time interval (t2 to t3) or the seventh unit time interval (t6 to t7), the first reference circuit 115-1 may correspond to a third output analog value (for example, Vout3), and the m-th reference circuit 115-m may correspond to the second output analog value (for example, Vout2).

The fourteenth switch 111-14 and the n3-th switch 111-n3 may be in an on state during the fourth unit time interval (t3 to t4) or the eighth unit time interval (t7 to t8), the first reference circuit 115-1 may correspond to a fourth output analog value (for example, Vout4), and the m-th reference circuit 115-m may correspond to the third output analog value (for example, Vout3).

Depending on design, the noise suppression circuit 110b may further include a clock generator 112 and a switching signal divider 113. The switching signal divider 113 may divide the switching signal Fns into a plurality of switching signals, and the clock generator 112 may convert the plurality of switching signals into clocks, and synchronize the plurality of switching signals.

Figure 4A:
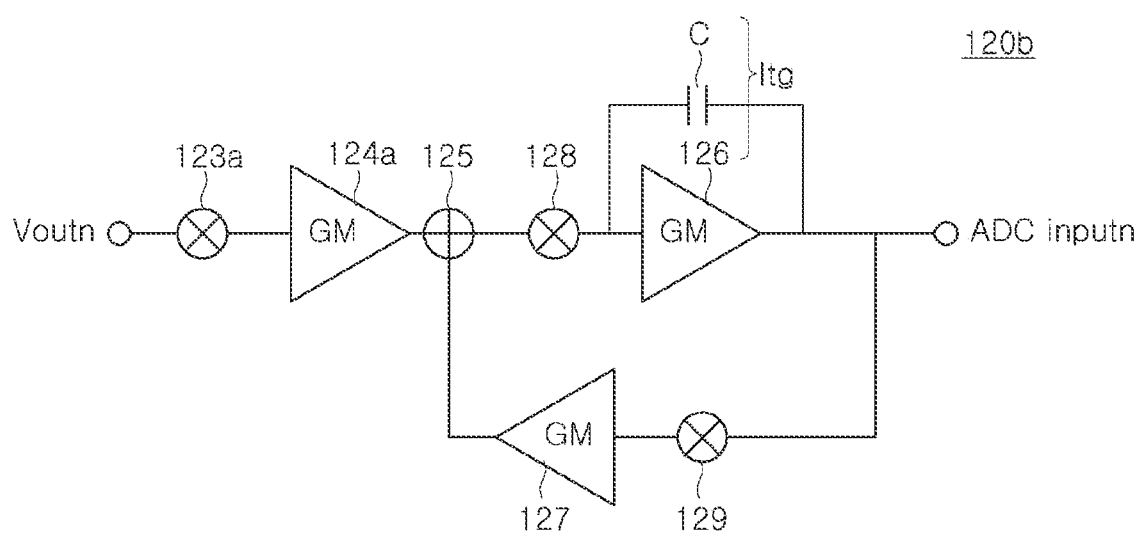
FIGS. 4A and 4B are diagrams respectively illustrating front-end analog circuits of the infrared image sensor illustrated in FIG. 1, according to embodiments.
Figure 4B:
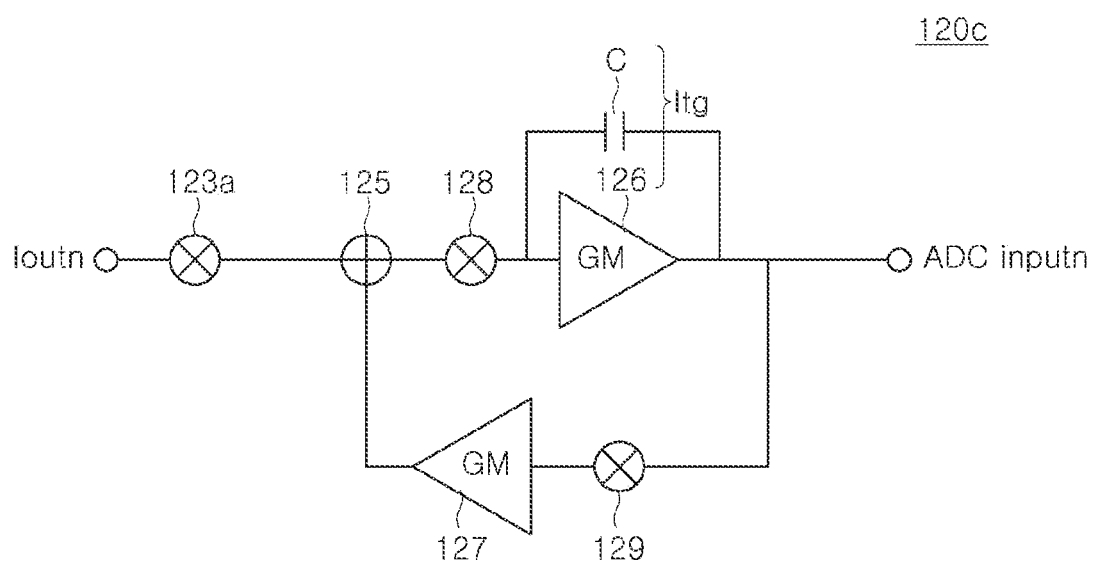

FIGS. 4A and 4B are diagrams respectively illustrating front-end analog circuits 120b and 120c, respectively, that may be included in the infrared image sensor 100a, according to embodiments.

Referring to FIGS. 4A and 4B, front-end analog circuits 120b and 120c may each include a plurality of integrators Itg that correspond to the plurality of bolometer cells of the bolometer, respectively, and each of the integrators Itg may include a second amplifier 126 and a capacitor C.

Each of the integrators Itg may sequentially integrate output analog values (for example, Voutn and Ioutn) before and after switching of a correspondence between the output analog values (for example, Voutn and Ioutn) and the reference analog values.

For example, the front-end analog circuits 120b and 120c may include a branch node 125 positioned between a plurality of bolometer cells and the integrator Itg, and electrically connecting a transfer path for an output analog value (for example, Voutn and Ioutn).

For example, the front-end analog circuit 120b may include a first amplifier 124a positioned between the plurality of bolometer cells and the plurality of integrator Itg, and electrically connected to the transfer path for the output analog value (for example, Voutn).

For example, the front-end analog circuits 120b and 120c may include a first chopper circuit 123 positioned between the plurality of bolometer cells and the integrator Itg, and electrically connected to the transfer path for the output analog value (for example, Voutn and Ioutn). The first chopper circuit 123 may modulate the output analog value (for example, Voutn and Ioutn).

For example, the front-end analog circuits 120b and 120c may include a second chopper circuit 128 electrically connected between the branch node 125 and the integrator Itg. The second chopper circuit 128 may modulate the value modulated by first chopper circuit 123.

The branch node 125 and/or the first amplifier 124a are electrically connected between the first chopper circuit 123 and the second chopper circuit 128.

For example, the front-end analog circuits 120b and 120c may each include a third chopper circuit 129 disposed on a feedback path from an output to an input of the integrator Itg.

For example, the front-end analog circuits 120b and 120c may each include a third amplifier 127 disposed on the feedback path from the output to the input of the integrator Itg.

Depending on designs, a gain GM of the first amplifier 124a, the second amplifier 126, and the third amplifier 127 may be 1, and the first amplifier 124a, the second amplifier 126, and the third amplifier 127 may be operated as a buffer circuit whose input impedance is greater than an output impedance.

Figure 5A:
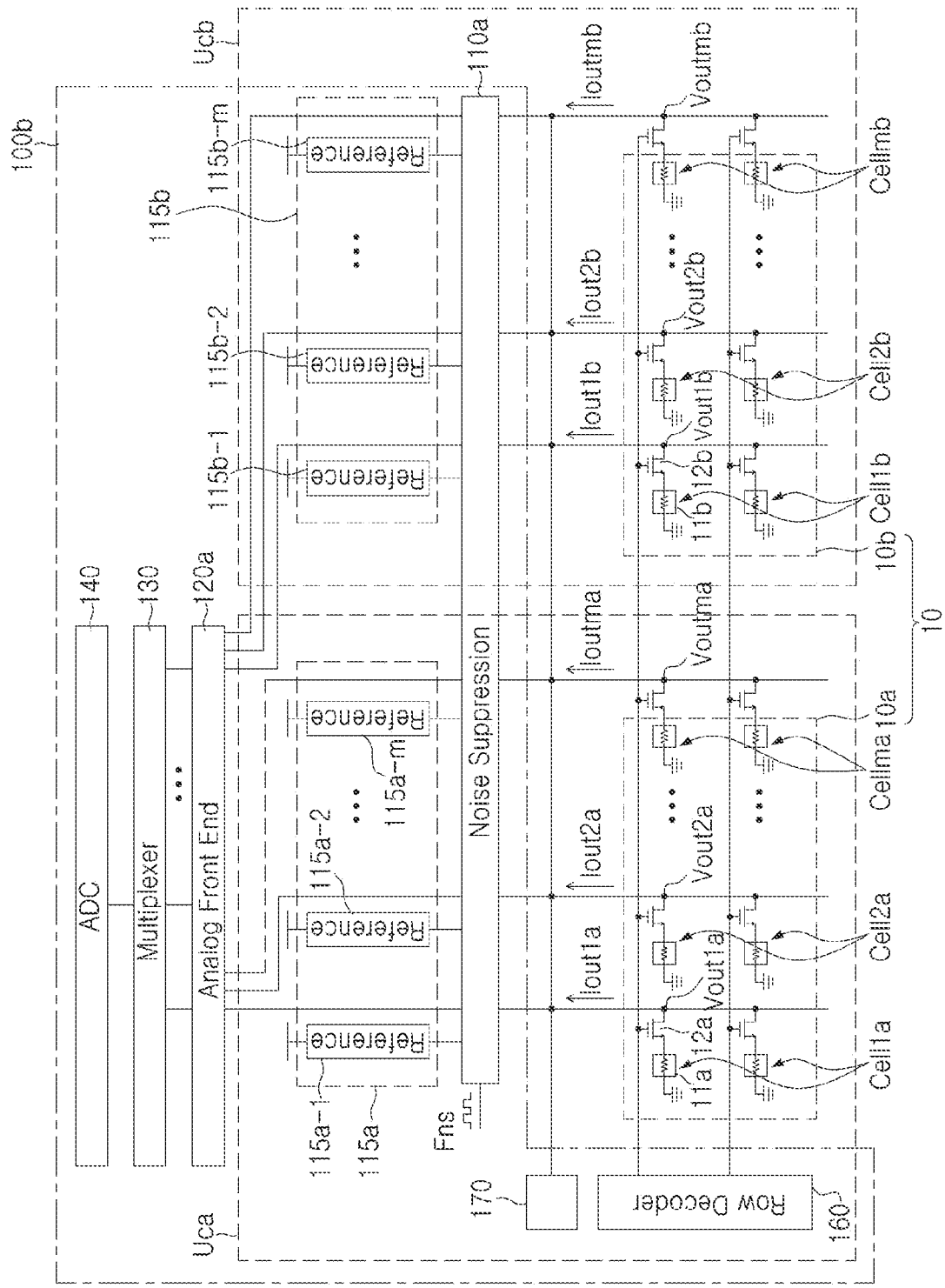
FIGS. 5A and 5B are diagrams respectively illustrating a plurality of cell groups of an infrared image sensor, according to an embodiment.
Figure 5B:
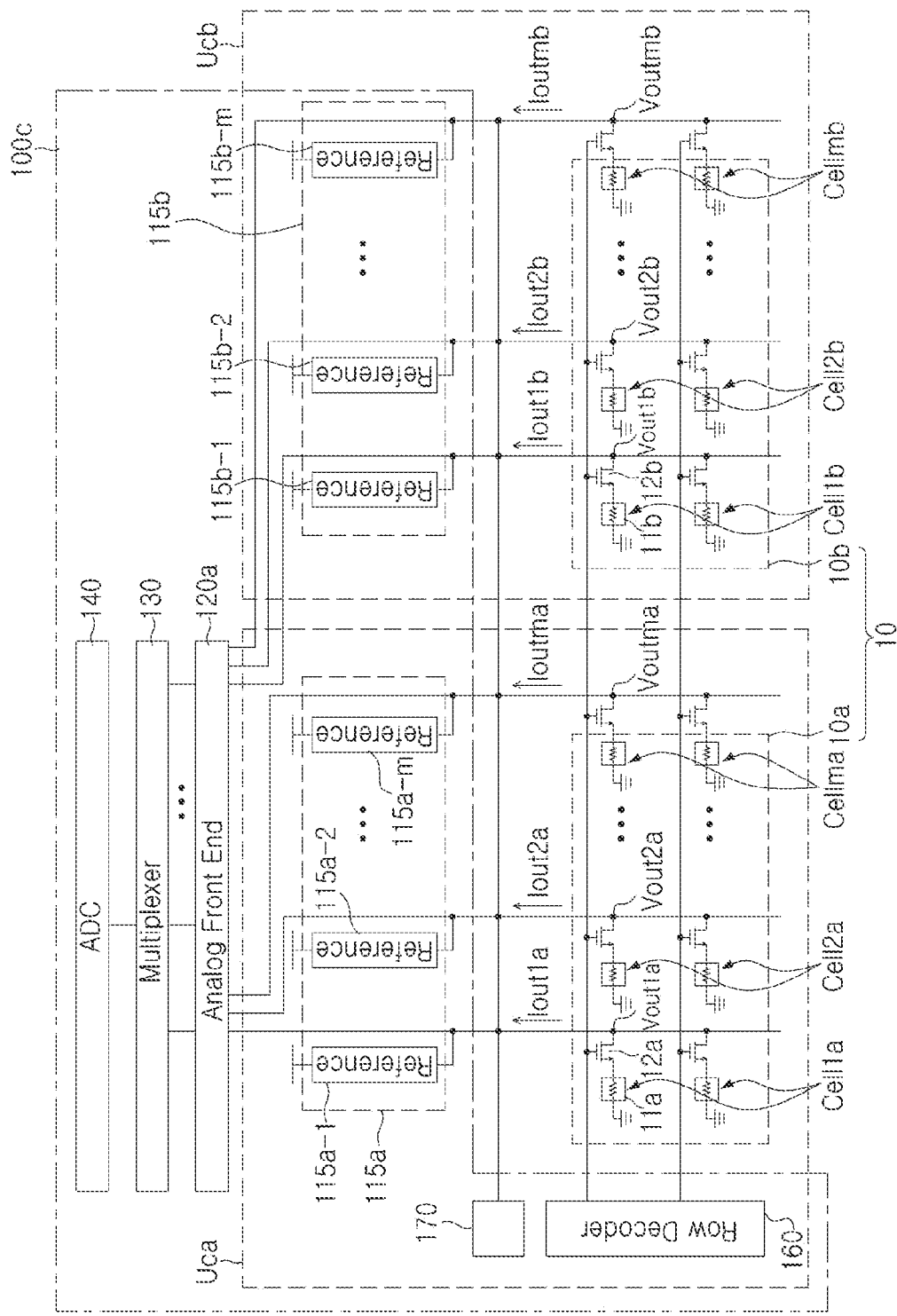

FIGS. 5A and 5B are diagrams respectively illustrating a plurality of cell groups 10a and 10b of infrared image sensors 100ab and 100c, respectively, according to embodiments.

Referring to FIGS. 5A and 5B, a bolometer 10 may include a plurality of cell groups 10a and 10b. Each of the cell groups 10a and 10b may include two or more bolometer cells cell1a, cell2a, and cellma, and cell1b, cell2b, and cellmb. Each of the two or more bolometer cells cell1a, cell2a, and cellma, and cell1b, cell2b, and cellmb may include a plurality of bolometer pixels 11a and 11b, and electrical connection between the bolometer pixels 11a and 11b and the infrared image sensor 100b or 100c may be controlled by a plurality of row decoders 12a and 12b.

A first group (115a-1, 115a-2, and 115a-m) of the reference circuits may be electrically connected to one of the cell groups 10a and 10b, and a second group (115b-1, 115b-2, and 115b-m) of the reference circuits may be electrically connected to the other one of the cell groups 10a and 10b. One of the cell groups 10a and 10b and the first group (115a-1, 115a-2, and 115a-m) of the reference circuits may be defined as a first cluster (Uca), and the other one of the plurality of cell groups 10a and 10b and the second group (115b-1, 115b-2, and 115b-m) of the reference circuits may be defined as a second cluster Ucb.

The first cluster Uca may transfer a first group (Iout1a, Iout2a, and Ioutma) of output currents or a first group (Vout1a, Vout2a, and Voutma) of output voltages to the front-end analog circuit 120a, and the second cluster Ucb may transfer a second group (Iout1b, Iout2b, and Ioutmb) of output currents or a second group (Vout1b, Vout2b, and Voutmb) of output voltages to the front-end analog circuit 120a.

Figure 6A:
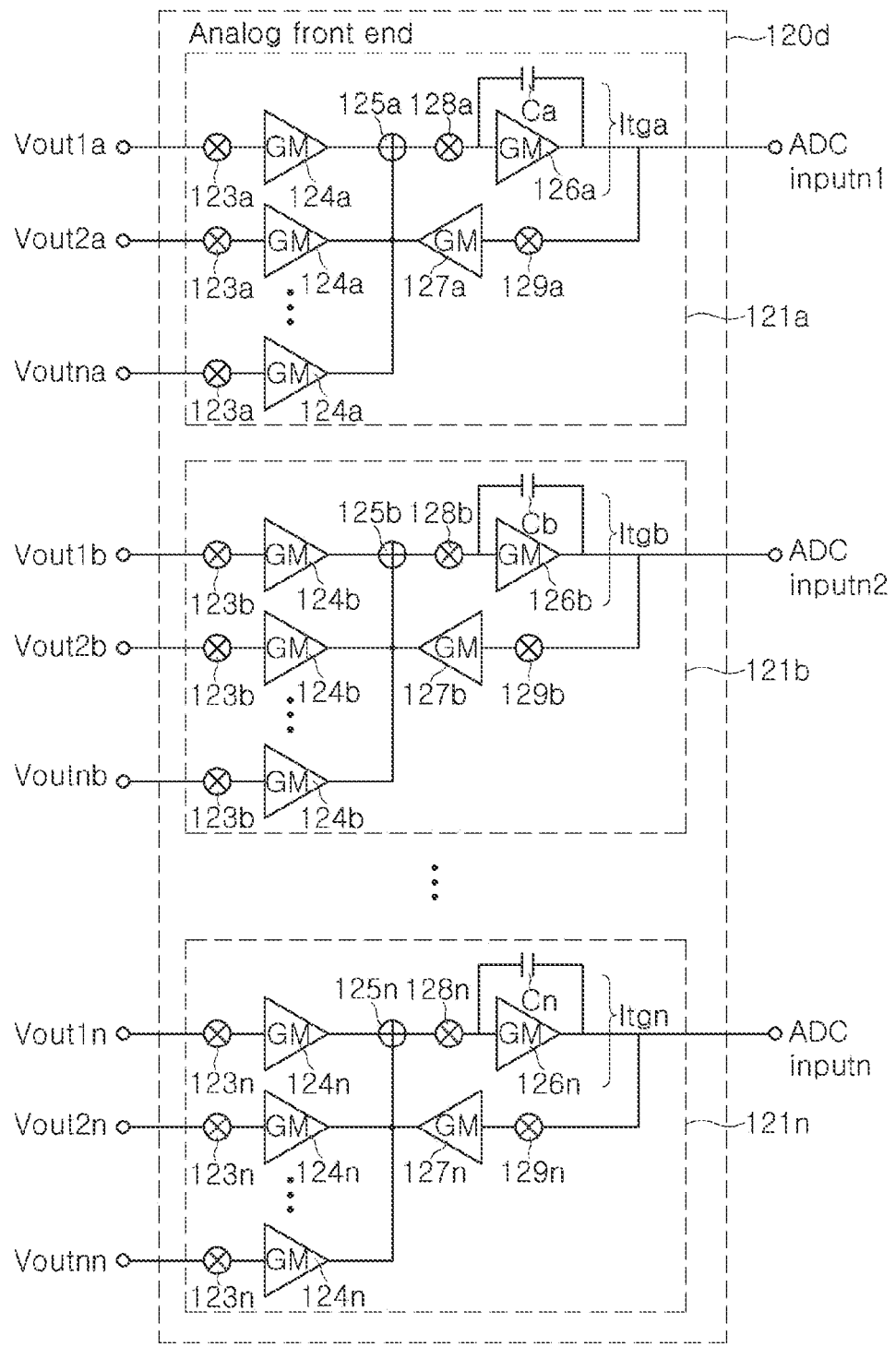
FIGS. 6A and 6B are diagrams illustrating front-end analog circuits of the infrared image sensor illustrated in FIGS. 5A and 5B, according to embodiments.
Figure 6B:
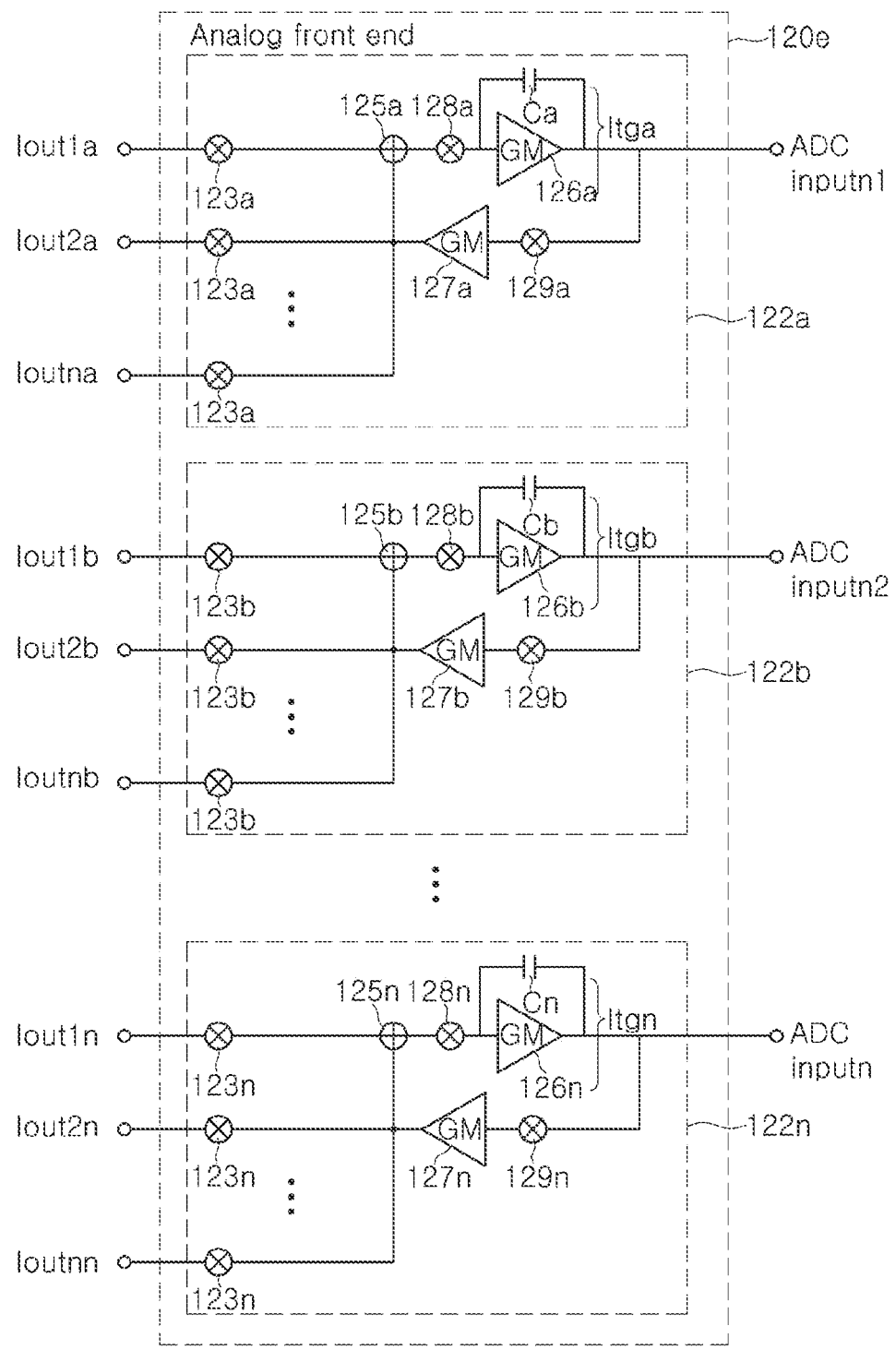

FIGS. 6A and 6B are diagrams illustrating front-end analog circuits 120d and 120e, respectively, that may be included in the infrared image sensors 100b and 100c illustrated in FIGS. 5A and 5B, respectively, according to embodiments.

Referring to FIGS. 6A and 6B, the front-end analog circuits 120d and 120e may include a plurality of analog processing circuits 121a, 121b, and 121n, and 122a, 122b, and 122n, respectively, in one-to-one correspondence with the plurality of cell groups 10a and 10b illustrated in FIGS. 5A and 5B and integrate at least two corresponding output analog values together. The plurality of analog processing circuits 121a, 121b, and 121n, and 122a, 122b, and 122n may include a plurality of integrators Itga, Itgb, and Itgn, respectively, in which a plurality of second amplifiers 126a, 126b, and 126n and a plurality of capacitors Ca, Cb, and Cn are combined.

For example, first analog processing circuits 121a and 122a may be electrically connected to one of the cell groups 10a and 10b, and may integrate a first group (Vout1a, Vout2a, Voutna, Iout1a, Iout2a, and Ioutna) of output analog values. For example, second analog processing circuits 121b and 122b may be electrically connected to another one of the cell groups 10a and 10b, and may integrate a second group (Vout1b, Vout2b, Voutnb, Iout1b, Iout2b, and Ioutnb) of output analog values.

Accordingly, noise introduced into the first group (Vout1a, Vout2a, Voutna, Iout1a, Iout2a, and Ioutna) of the output analog values may be divided or averaged, and thus, an overall magnitude of the noise of the first group (Vout1a, Vout2a, Voutna, Iout1a, Iout2a, and Ioutna) of the output analog values may be reduced. Further, noise introduced into the second group (Vout1b, Vout2b, Voutnb, Iout1b, Iout2b, and Ioutnb) of the output analog values may be divided or averaged, and thus, an overall magnitude of the noise of the second group (Vout1b, Vout2b, Voutnb, Iout1b, Iout2b, and Ioutnb) of the output analog values may be reduced. Therefore, the infrared image sensor 100b or 100c may reduce noise of the acquired infrared image.

For example, the front-end analog circuits 120d and 120e may include a plurality of branch nodes 125a, 125b, and 125n positioned between the plurality of cell groups 10a and 10b and the plurality of integrators Itga, Itgb, and Itgn, and each electrically connecting transfer paths for at least two output analog values (for example, Vout1a, Vout2a, Voutna, Iout1a, Iout2a, and Ioutna).

For example, the front-end analog circuits 120d may include a plurality of first amplifiers 124a, 124b, and 124n positioned between the plurality of cell groups 10a and 10b and the plurality of integrators Itga, Itgb, and Itgn, and electrically connected to the transfer paths for a plurality of output analog values (for example, Vout1a, Vout2a, Voutna, Iout1a, Iout2a, and Ioutna), respectively.

For example, the front-end analog circuits 120d and 120e may include a plurality of first chopper circuits 123a, 123b, and 123n positioned between the plurality of cell groups 10a and 10b and the plurality of integrators Itga, Itgb, and Itgn, and electrically connected to the transfer paths for a plurality of output analog values (for example, Vout1a, Vout2a, Voutna, Iout1a, Iout2a, and Ioutna), respectively. The plurality of first chopper circuits 123a, 123b, and 123n may modulate the plurality of output analog values (for example, Vout1a, Vout2a, Voutna, Iout1a, Iout2a, and Ioutna).

For example, the front-end analog circuit 120d and 120e may include a plurality of second chopper circuits 128a, 128b, and 128n electrically connected between the plurality of branch nodes 125a, 125b, and 125n and the plurality of integrators Itga, Itgb, and Itgn. The plurality of second chopper circuits 128a, 128b, and 128n may modulate values modulated by the plurality of first chopper circuits 123a, 123b, and 123n.

The plurality of branch nodes 125a, 125b, and 125n and/or the plurality of first amplifiers 124a, 124b, and 124n are electrically connected between the plurality of first chopper circuits 123a, 123b, and 123n, and the plurality of second chopper circuits 128a, 128b, and 128n, and, therefore, it is possible to reduce an influence of the noise and/or offset introduced into the first group (Vout1a, Vout2a, Voutna, Iout1a, Iout2a, and Ioutna) of the output analog values and the second group (Vout1b, Vout2b, Voutnb, Iout1b, Iout2b, and Ioutnb) on amplification performed by the plurality of second amplifiers 126a, 126b, and 126n, and integration performed by the plurality of integrators Itga, Itgb, and Itgn. The noise and/or offset may be eliminated by a circuit element (for example, a sample and hold circuit, a low pass filter, a multiplexer, or an AD converter) electrically connected to an outer terminal of the front-end analog circuit 120d or 120e.

For example, the front-end analog circuits 120d and 120e may each include a plurality of third chopper circuits 129a, 129b, and 129n each disposed on a plurality of feedback paths from an output to an input of a corresponding integrator among the plurality of integrators Itga, Itgb, and Itgn.

The first chopper circuits 123a, 123b, and 123n, the second chopper circuits 128a, 128b, and 128n, and the third chopper circuits 129a, 129b, and 129n may cancel imbalance (for example, offset) between the analog processing circuits 121a, 121b, 121n, 122a, 122b, and 122n, and may reduce flicker noise in the front-end analog circuits 120d and 120e.

For example, the front-end analog circuits 120d and 120e may each include a plurality of third amplifiers 127a, 127b, and 127n each disposed on a plurality of feedback paths from an output to an input of a corresponding integrator among the plurality of integrators Itga, Itgb, and Itgn.

Depending on designs, a gain GM of each of the first amplifiers 124a, 124b, and 124n, the second amplifiers 126a, 126b, and 126n, and the third amplifiers 127a, 127b, and 127n may be 1, and each of the first amplifiers 124a, 124b, and 124n, the second amplifiers 126a, 126b, and 126n, and the third amplifiers 127a, 127b, and 127n may be operated as a buffer circuit whose input impedance is greater than an output impedance. Each of the analog processing circuits 121a, 121b, 121n, 122a, 122b, and 122n corresponds to a plurality of bolometer cells, and thus, an average gain GM of the plurality of analog processing circuits 121a, 121b, 121n, 122a, 122b, and 122n may be decreased by the number of bolometer cells corresponding to each of the plurality of analog processing circuits 121a, 121b, 121n, 122a, 122b, and 122n.

Figure 7:
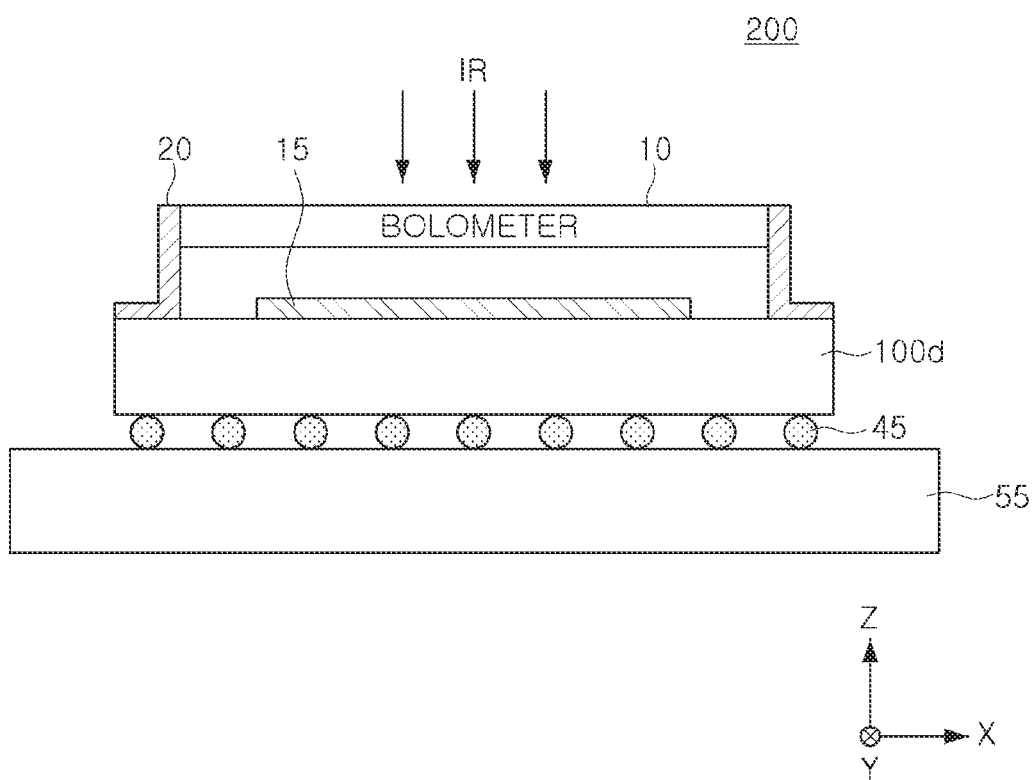
FIG. 7 is a diagram illustrating an infrared image sensor package, according to an embodiment.

FIG. 7 is a diagram illustrating an infrared image sensor package 200, according to an embodiment.

Referring to FIG. 7, the infrared image sensor package 200 may include an infrared image sensor 100d. The infrared image sensor 100d may be implemented by an integrated circuit (IC), and may be mounted on a board 55, such as a printed circuit board, through an electrical connection structure, such as a solder ball 45.

The bolometer 10 may be disposed above the infrared image sensor 100d, and may be disposed so that infrared light IR passing through a lens is directed to the bolometer 10.

A reflection layer 15 may be disposed between the infrared image sensor 100d and the bolometer 10, and may reflect the infrared light IR. An upper surface of the infrared image sensor 100d may be used as a space in which the reflection layer 15 is disposed. A distance between the reflection layer 15 and the bolometer 10 may correspond to ¼ of a wavelength of the infrared light IR.

A via 20 may form an electrical connection between the infrared image sensor 100d and the bolometer 10, and may be used as a transfer path of an output analog value of the bolometer 10.

As set forth above, according to embodiments disclosed herein, an infrared image sensor may move noise that may be introduced in a process of acquiring an infrared image to an unused frequency range, or divide or average the noise, thereby reducing the noise.

The clock generator 112, the switching signal divider 113, the row decoder 160, and the offset canceller 170 in FIGS. 1 to 7 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 7 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An infrared image sensor, comprising:
a plurality of reference circuits configured to provide a plurality of reference analog values to a plurality of bolometer cells, respectively;
a front-end analog circuit configured to collect a plurality of output analog values according to the plurality of reference analog values; and
a noise suppression circuit configured to reduce an imbalance between the reference analog values by switching a correspondence between the plurality of bolometer cells and the plurality of reference analog values at unit time intervals.

2. The infrared image sensor of claim 1, wherein the noise suppression circuit is further configured to perform switching so as to repeat the correspondence between the plurality of bolometer cells and the plurality of reference analog values at image time intervals that are longer than the unit time interval.

3. The infrared image sensor of claim 2, wherein the plurality of reference circuits include first to m-th reference circuits,
wherein the plurality of bolometer cells include first to m-th bolometer cells, and
wherein the noise suppression circuit is further configured to perform switching so that the first to m-th reference circuits correspond to the first to m-th bolometer cells, respectively, at least once during the image time interval.

4. The infrared image sensor of claim 1, wherein the front-end analog circuit is further configured to output a plurality of infrared image values to which a plurality of output analog values before the switching of the correspondence between the plurality of bolometer cells and the plurality of reference analog values, and a plurality of output analog values after the switching are applied together.

5. The infrared image sensor of claim 4, further comprising a multiplexer configured to receive the plurality of infrared image values through a plurality of input paths, and provide, to an AD converter, the plurality of infrared image values through output paths less in number than the plurality of input paths.

6. The infrared image sensor of claim 4, wherein the front-end analog circuit includes a plurality of integrators, and wherein each of the plurality of integrators is configured to sequentially integrate the plurality of output analog values before and after the switching of the correspondence between the plurality of bolometer cells and the plurality of reference analog values.

7. The infrared image sensor of claim 1, wherein the plurality of bolometer cells are configured as a plurality of cell groups each including two or more bolometer cells, and
wherein the front-end analog circuit includes a plurality of integrators in one-to-one correspondence with the plurality of cell groups and configured to integrate at least two corresponding output analog values, among the plurality of output analog values, together.

8. The infrared image sensor of claim 7, wherein the front-end analog circuit further includes a plurality of branch nodes positioned between the plurality of cell groups and the plurality of integrators, and each electrically connecting transfer paths for the at least two corresponding output analog values to each other.

9. The infrared image sensor of claim 1, wherein each of the plurality of bolometer cells includes a plurality of bolometer pixels.

10. The infrared image sensor of claim 1, wherein the noise suppression circuit is configured to reduce the imbalance between the reference analog values by moving noise introduced in a process of acquiring an infrared image to an unused frequency range.

11. The infrared image sensor of claim 1, wherein the noise suppression circuit is configured to reduce the imbalance between the reference analog values by dividing noise associated with the reference analog values.

12. The infrared image sensor of claim 1, wherein the noise suppression circuit is configured to reduce the imbalance between the reference analog values by averaging noise associated with the reference analog values.

13. An infrared image sensor, comprising:
a plurality of reference circuits configured to provide a plurality of reference analog values to a plurality of bolometer cells, respectively;
a front-end analog circuit configured to collect a plurality of output analog values according to the plurality of reference analog values; and
a noise suppression circuit configured to switch a correspondence between the plurality of bolometer cells and the plurality of reference analog values at unit time intervals,
wherein the front-end analog circuit is further configured to output a plurality of infrared image values to which a plurality of output analog values before the switching of the correspondence between the plurality of bolometer cells and the plurality of reference analog values, and a plurality of output analog values after the switching are applied together,
wherein the front-end analog circuit includes a plurality of integrators, and
wherein each of the plurality of integrators is configured to sequentially integrate the plurality of output analog values before and after the switching of the correspondence between the plurality of bolometer cells and the plurality of reference analog values.

14. The infrared image sensor of claim 13, wherein the noise suppression circuit is further configured to perform switching so as to repeat the correspondence between the plurality of bolometer cells and the plurality of reference analog values at image time intervals that are longer than the unit time interval.

15. The infrared image sensor of claim 13, wherein each of the plurality of bolometer cells includes a plurality of bolometer pixels.

16. An infrared image sensor, comprising:
a plurality of reference circuits configured to provide a plurality of reference analog values to a plurality of bolometer cells, respectively;
a front-end analog circuit configured to collect a plurality of output analog values according to the plurality of reference analog values; and
a noise suppression circuit configured to switch a correspondence between the plurality of bolometer cells and the plurality of reference analog values at unit time intervals,
wherein the plurality of bolometer cells are configured as a plurality of cell groups each including two or more bolometer cells,
wherein the front-end analog circuit includes a plurality of integrators in one-to-one correspondence with the plurality of cell groups and configured to integrate at least two corresponding output analog values, among the plurality of output analog values, together, and
wherein the front-end analog circuit further includes a plurality of branch nodes positioned between the plurality of cell groups and the plurality of integrators, and each electrically connecting transfer paths for the at least two corresponding output analog values to each other.

17. The infrared image sensor of claim 16, wherein the noise suppression circuit is further configured to perform switching so as to repeat the correspondence between the plurality of bolometer cells and the plurality of reference analog values at image time intervals that are longer than the unit time interval.

18. The infrared image sensor of claim 16, wherein each of the plurality of bolometer cells includes a plurality of bolometer pixels.

* * * * *